US006826090B1

(12) United States Patent
Chu et al.

(10) Patent No.: US 6,826,090 B1
(45) Date of Patent: Nov. 30, 2004

(54) APPARATUS AND METHOD FOR A RADIATION RESISTANT LATCH

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 10/455,161

(22) Filed: Jun. 5, 2003

(51) Int. Cl.[7] .............................................. G11C 7/00
(52) U.S. Cl. ........................... 365/189.05; 365/185.09; 365/206; 326/98
(58) Field of Search ..................... 365/189.05, 185.09, 365/206; 326/98

(56) References Cited

U.S. PATENT DOCUMENTS

| | | | |
|---|---|---|---|
| 4,688,219 A | 8/1987 | Takemae | 371/10 |
| 4,942,575 A | 7/1990 | Earnshaw et al. | 371/10.14 |
| 5,162,731 A | * 11/1992 | Fujimaki | 324/248 |
| 5,311,070 A | * 5/1994 | Dooley | 327/208 |
| 5,338,963 A | 8/1994 | Klaasen et al. | 257/376 |
| 5,436,572 A | 7/1995 | Sugiyama | 326/12 |
| 5,508,634 A | 4/1996 | Sugiyama | 326/12 |
| 5,600,260 A | 2/1997 | LaMacchia et al. | 326/11 |
| 5,896,046 A | 4/1999 | Bjorksten et al. | 326/98 |
| 6,046,606 A | 4/2000 | Chu et al. | 326/95 |
| 6,275,080 B1 | * 8/2001 | Phan et al. | 327/200 |
| 6,339,550 B1 | 1/2002 | Wanlass | 365/189.01 |
| 6,348,356 B1 | 2/2002 | Shabde et al. | 438/14 |
| 6,696,873 B2 | * 2/2004 | Hazucha et al. | 327/203 |

FOREIGN PATENT DOCUMENTS

JP 63-197113 A 8/1988 ........ H03K/3/037

OTHER PUBLICATIONS

"Soft–Error Free Differential ECL Latch," IBM Technical Disclosure Bulletin, vol. 32, No. 7, Dec. 1989, pp. 73–74.
Weaver, H.T., et al., "Soft Error Protection using Asymmetric Response Latches," IEEE Transactions on Electron Devices, vol. 38, No. 6, Jun. 1991, pp. 1555–1557.
J.A. Hoffman, "Twice Redundant Radiation Hardened Latch," IBM Technical Disclosure Bulletin, vol. 30, No. 8, Jan. 1988, pp. 248–249.
D.B. Eardley, "Latch Circuit Insensitive to Disturb by Alpha Particles," IBM Technical Disclosure Bulletin, vol. 24, No. 12, May 1982, pp. 6461–6462.
D.L. Arlington, et al., "On–Chip Logic Enhancements for Test of Error Checking and Correcting Related Functions in On–Card Applications," IBM Technical Disclosure Bulletin, vol. 30, No. 12, May 1988, pp. 247–250.

* cited by examiner

*Primary Examiner*—Richard Elms
*Assistant Examiner*—Tuan T. Nguyen
(74) *Attorney, Agent, or Firm*—Mark E. McBurney; Anthony V.S. England

(57) ABSTRACT

In one form of the invention, a radiation resistant latch has an overall output node, and first, second and third sublatches. The sublatches each have input circuitry, an output node coupled to the sublatch's input circuitry and feedback circuitry coupled to the sublatch's output node for reinforcing an output signal of the sublatch. The sublatches are operable to receive a data signal at their respective input circuitry and responsively generate binary-state output signals on their respective output nodes. The first and second sublatches are coupled to the third sublatch and the third sublatch has its output signal coupled to the overall output node such that if any one of the three sublatches is subjected to a radiation induced erroneous change of state, the output signals of the other two sublatches reduce an effect of the third sublatch feedback circuitry on an overall output signal for the latch.

20 Claims, 5 Drawing Sheets

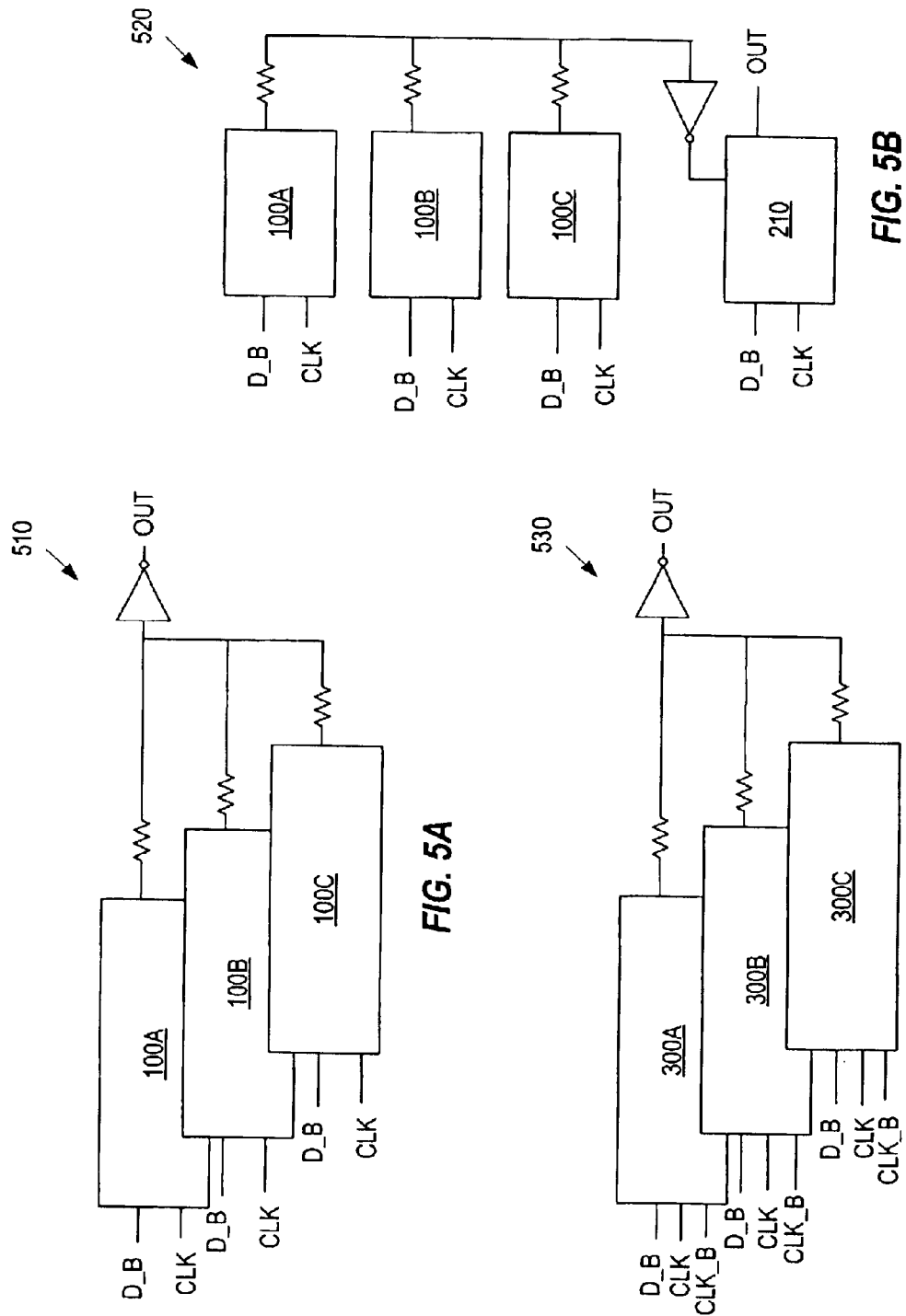

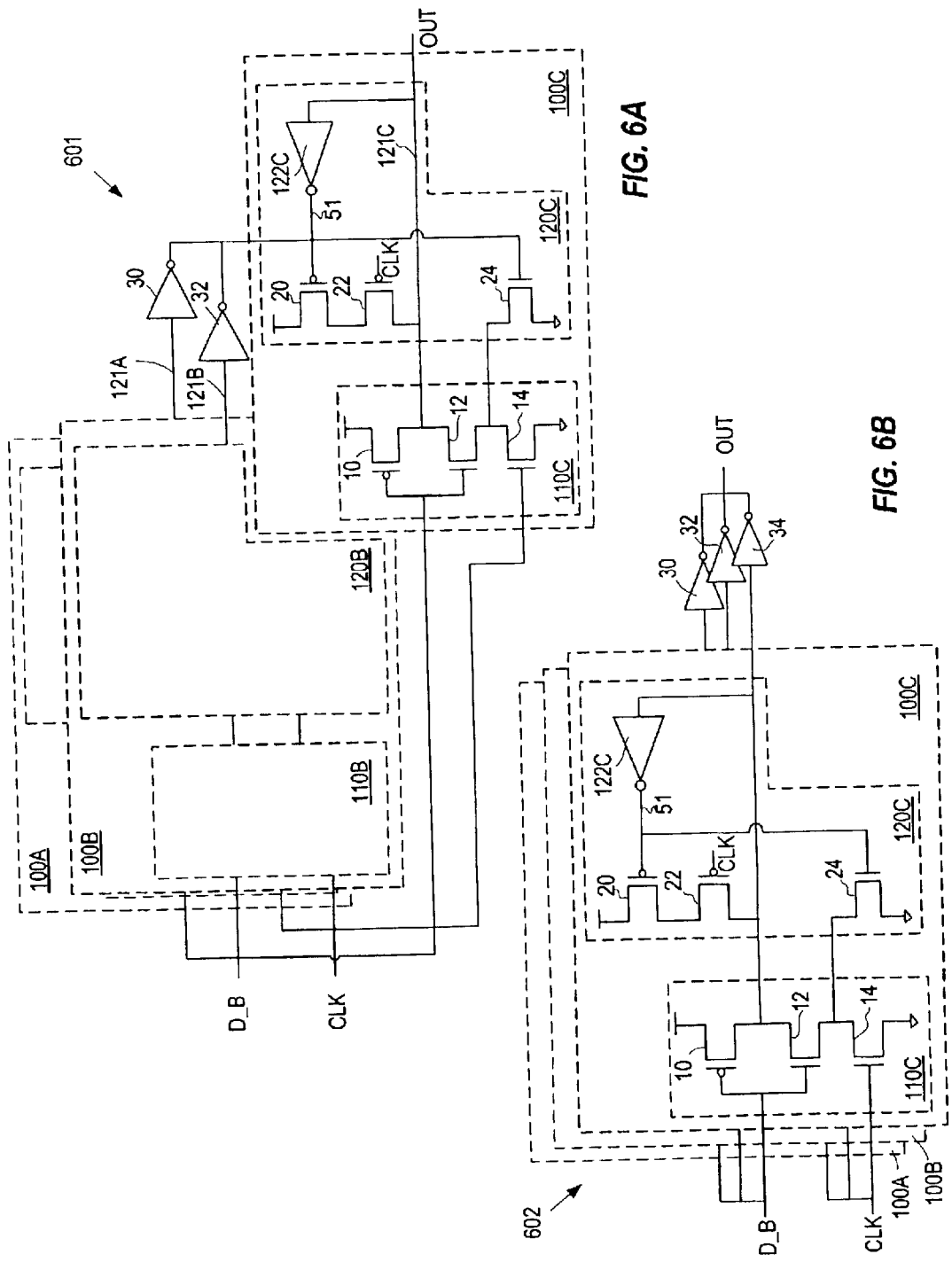

US 6,826,090 B1

APPARATUS AND METHOD FOR A RADIATION RESISTANT LATCH

RELATED APPLICATION

This application is related to the following application Ser. No. 10/455,163 filed on the same date as the present application and hereby incorporated herein by reference: "APPARATUS AND METHOD FOR A RADIATION RESISTANT LATCH WITH INTEGRATED SCAN."

BACKGROUND

1. Field of the Invention

The present invention relates to latch circuitry and more particularly to radiation resistant latch circuitry.

2. Related Art

Domino logic latching circuits are known in the art. For example, the latch circuit 100 of FIG. 1 shown here was disclosed in U.S. Pat. No. 5,896,046, "Latch structure for ripple domino logic," Apr. 20, 1999, which is hereby incorporated herein by reference. Latch circuit 100 includes an input stage 10 and a feedback stage 120. In FIG. 1, it is assumed that the data signal D_B comes from a preceding domino logic stage. During an evaluate phase the clock signal goes high and the data signal D_B is held high or driven low by the preceding domino logic stage. With the clock signal high, the latch circuit 100 permits the data signal to drive its latch node 121 high or low. Then, during a precharge phase, the data signal D_B goes high and the clock signal CLK goes low. According to the arrangement shown for circuit 100, with the data and clock signals in their precharge states feedback through inverter 122 will keep the latch node 121 high or low regardless of whether the latch node was driven high or low during evaluation.

Another prior art domino latch circuit is the domino lookaside latch 200 shown in FIG. 2. This circuit improves immunity to noise on the output node OUT by feeding forward to the output node from the inputs, data D_B and clock CLK, through circuit 100 and inverter 201 coupled to feed forward node 211, instead of feeding back from the output node. (In FIG. 2 and other FIG's herein where circuit reference numbers 100, 100A, 100B, etc. are shown it should be understood that such circuits are instances of circuit 100 shown in FIG. 1. Likewise the same applies to circuit reference numbers 300, 300A, etc. being instances of circuit 300 shown in FIG. 3.)

Another prior art latch circuit 300 is shown in FIG. 3. In this circuit 300, cross coupled inverters 311 and 312 provide a memory cell 310 coupled to the latch node 301, which provides output node OUT. A pair of parallel pass gates 320 controlled by the clock signal CLK and its complement CLK_B are interposed between the latch node 301 and a data signal IN. A single inverter 330 is interposed between the latch node 301 and the output node OUT. According to this arrangement, when the clock signal CLK is high the data signal IN drives the latch node 301 high or low, as the case may be, and when the clock signal is low the memory cell 310 keeps the latch node 301 high or low.

One problem with all these prior art arrangements is that cosmic rays and alpha particles can collide with a latch node and cause it and an output to switch states erroneously. One way that this has been addressed in the past has been to add charge on the latch node. While this solution tends to be effective to prevent erroneous switching caused by alpha particles, it is not very effective against cosmic rays, which have much higher energy.

Another way this has been addressed for a latch of the memory cell type is shown in FIG. 4, which was disclosed in IBM Technical Disclosure Bulletin, volume 30, No. 8, January 1988, Twice Redundant Radiation Hardened Latch, pages 248 through 249, and which is hereby incorporated herein by reference. According to this arrangement, three memory cell latch nodes B1, B2 and B3 are tied together to a single output inverter 401 via respective resistors 411A, 411B and 411C. The resistors are necessarily rather large in order to be effective, so they tend to adversely affect performance of the circuit 400. Therefore a need exists for improvements in radiation immunity for latches.

SUMMARY OF THE INVENTION

The foregoing need is addressed in the present invention. In one form of the invention, a radiation resistant latch has an overall output node, and first, second and third sublatches. The sublatches each have input circuitry, an output node coupled to the sublatch's input circuitry and feedback circuitry coupled to the sublatch's output node for reinforcing an output signal of the sublatch. The sublatches are operable to receive a data signal at their respective input circuitry and responsively generate binary-state output signals on their respective output nodes. The first and second sublatches are coupled to the third sublatch and the third sublatch has its output signal coupled to the overall output node such that if any one of the three sublatches is subjected to a radiation induced erroneous change of state, the output signals of the other two sublatches reduce an effect of the third sublatch feedback circuitry on an overall output signal for the latch.

Objects, advantages, additional aspects and other forms of the invention will become apparent upon reading the following detailed description and upon reference to the accompanying drawings.

BRIEF DESCRIPTION OF THE FIGURES

FIGS. 5A, 5B and 5C illustrate three different twice redundant latches.

FIGS. 6A and 6B illustrate latch circuits having a more limited redundancy, according to an embodiment of the present invention.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
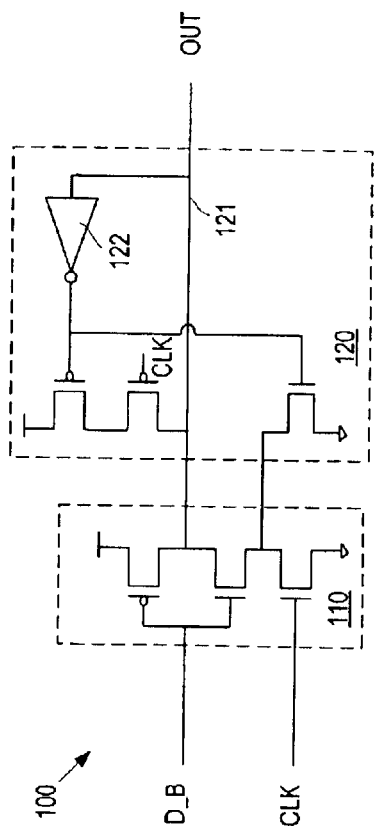
FIG. 1 illustrates a domino latch circuit, according to prior art.
Figure 2:
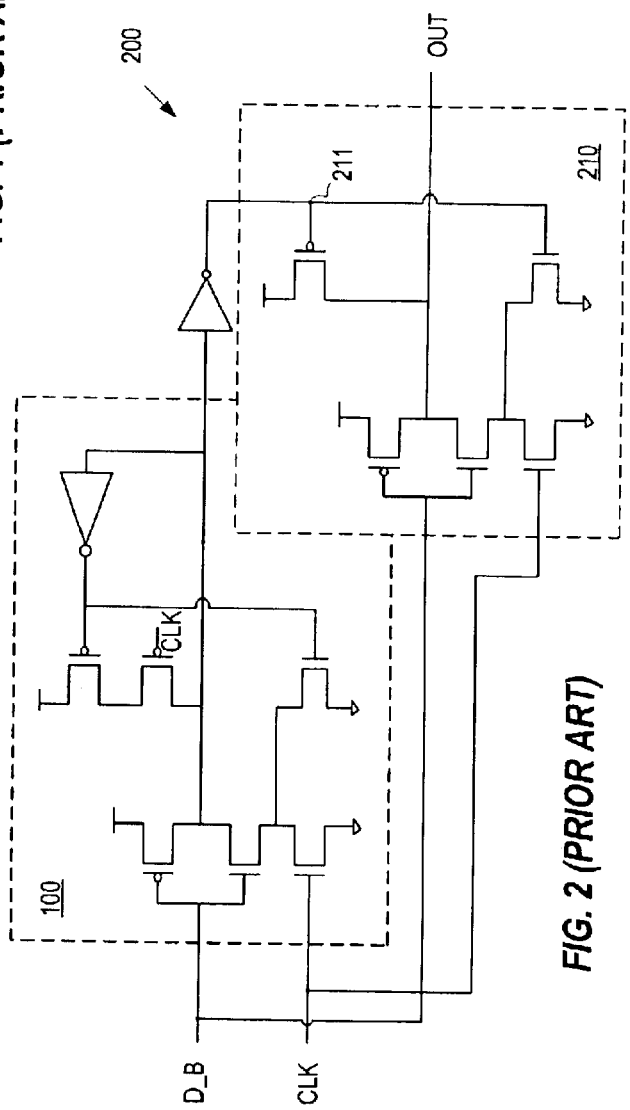
FIG. 2 illustrates a lookaside domino latch circuit, according to prior art.
Figure 3:
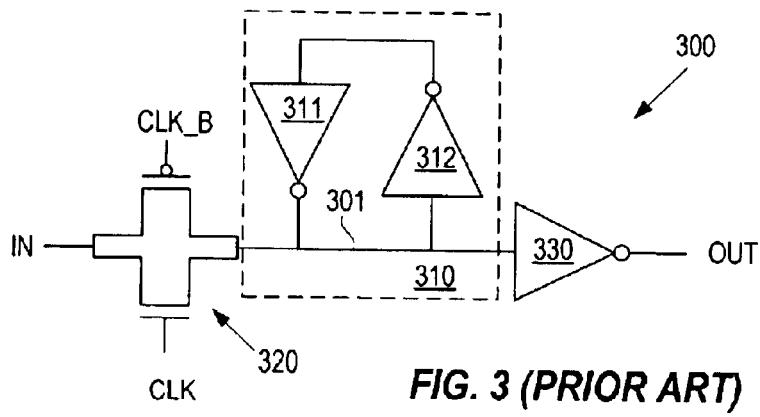
FIG. 3 illustrates a latch circuit of a memory cell type, according to prior art.
Figure 4:
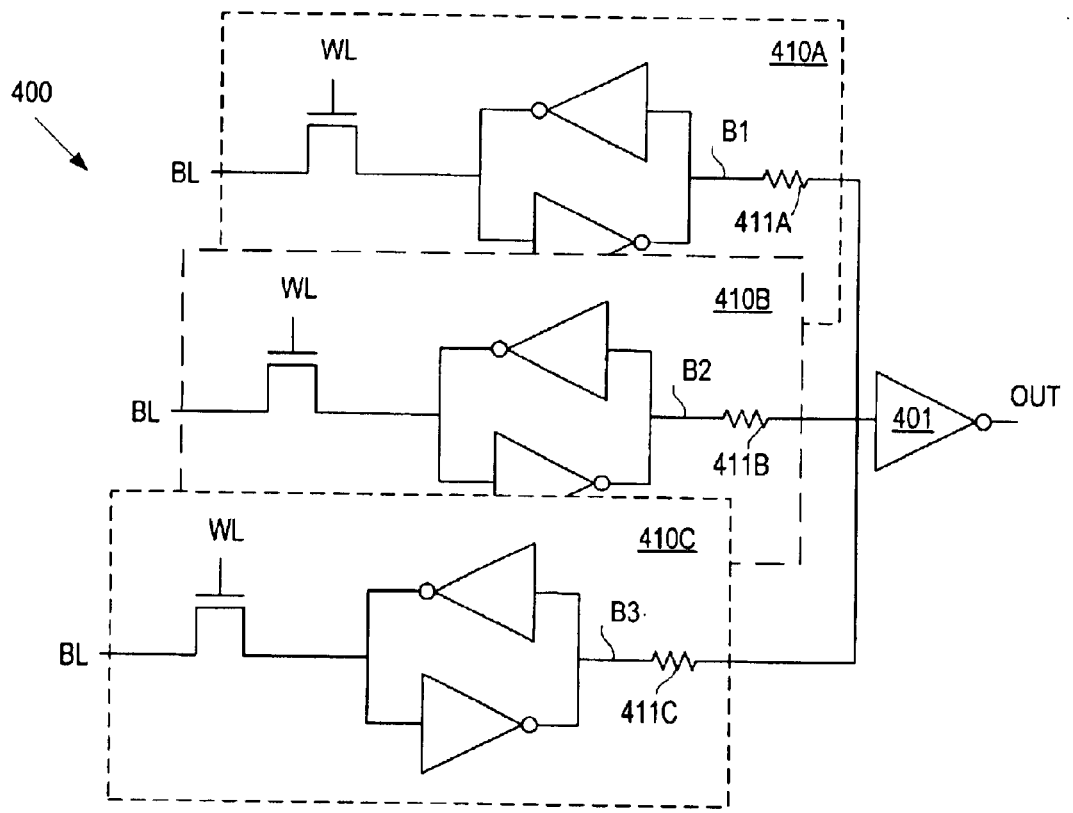
FIG. 4 illustrates a latch circuit of the memory cell type which has two redundant memory cells, according to prior art.

It is not necessarily obvious how to apply prior art FIG. 4, if at all, to the problem of improving immunity of latches to radiation. One reason this is true is that it is not obvious which prior art latch circuit to consider as the best subject to which FIG. 4 may be applied. Further, even having selected the circuits 100, 200 and 300 of FIGS. 1, 2 and 3 as candidates for the application of the teaching of FIG. 4 to improve their immunity to radiation, it is not obvious how the teaching of FIG. 4 should be applied. For example, mapping FIG. 4 directly to FIG. 1, circuit 100 would be made twice redundant in the manner shown in circuit 510 of FIG. 5A, in which three instances of the circuit, circuit 100A, 100B and 100C, with respective output resistors are connected in parallel to a common output inverter. Likewise, mapping FIG. 4 directly to FIG. 2, circuit 520 of FIG. 5B has three instances of the circuit 100A, 100B and 100C with respective output resistors connected in parallel to a common output inverter feeding forward to latch 210. Similarly, mapping FIG. 4 directly to FIG. 3, circuit 530 of FIG. 5C has three instances of circuit 300, i.e., circuits 300A, 300B and 300C, with respective output resistors connected in parallel to a common output inverter.

Note, however, these arrangements of FIGS. 5A, 5B and 5C are not necessarily optimal. The arrangement of FIG. 5B is especially cumbersome for the twice redundant lookaside domino latch circuit 520, since latch 200 (FIG. 2) is already somewhat large and the extent of redundancy in circuit 520 increases the size of the latch quite substantially.

Referring now to FIG. 6A, a domino latch 601 is shown, according to an embodiment of the present invention. Latch 601 includes three domino latches 100A, 100B and 100C, which may be referred to herein as "sublatches," whereas latch 601 may be referred to herein as the "overall" latch. The latch 601 provides immunity to noise on its output node OUT. The noise immunity is substantially as effective as that of the lookaside domino latch 200 (FIG. 2) but with improved radiation immunity substantially as effective as the twice redundant lookaside latch circuit 520 (FIG. 5B).

By comparison to the domino latch 100 (FIG. 1), the lookaside latch 200 (FIG. 2) and the twice redundant latches 510 (FIG. 5A) and 520 (FIG. 5B), it should be noted that latch 601 has some aspects in common with these other latches and has some significant differences. Latch 200 has a single latch node domino sublatch circuit 100 and employs its output node circuitry 210 for feeding forward the signal from sublatch circuit 100 to keep its output signal high or low during precharge and to provide immunity to noise on the output node OUT. Applying the teaching of FIG. 4, the twice redundant lookaside latch 520 has output node circuitry 210 and three sublatch node circuits 100A, 100B and 100C, two of which are redundant latch node circuits. Latch 601, on the other hand, has only two independent feed forward, domino sublatch circuits, circuit 100A and circuitry 100B, feeding forward to output domino sublatch circuit 100C. That is, only one of the feed forward circuits 100A and 100B is redundant. Latch 601 has only one the redundant feed forward circuit of the of circuit 100 type because in latch 601, circuitry 120C is employed for both feeding forward the signals from the independent latch node domino sublatch circuits 100A and 100B and feeding back the output signal from the output node OUT, unlike the feed forward only circuitry 210 of the lookaside latch 200 (FIG. 2) or the twice redundant lookaside latch 520 (FIG. 5B). Consequently, circuitry 120C is referred to herein as "feedback/feed forward" circuitry. However, circuitry 120C may also be referred to herein as merely "feedback" circuitry.

More particularly, latch 601 includes the two feed forward domino sublatches 100A and 100B coupled to feedback circuitry 120C of third domino sublatch 100C. The domino sublatch 100C in turn has its output node 121C coupled to the overall radiation resistant latch 601 output node OUT. In another manner of speaking, since node 121C is directly coupled to the overall output node OUT with no device interposed there between it may be said that node 121C provides the overall output node OUT. First domino sublatch circuit 100A is coupled to the data input D_B and clock input CLK, for receiving signals of the same name, and its output node 121A provides a latch node that is coupled at FF to feedback/feed forward circuitry 120C via inverter 30. (Inverter 30 may be considered to be part of sublatch 100A, and may accordingly be referred to herein as an output inverter of the sublatch 100A.) Similarly, second domino sublatch circuit 100B is coupled to receive the data and clock signals, and its output node 121B provides a latch node that is coupled at FF to feedback/feed forward circuitry 120C via inverter 32. (Inverter 32 may be considered to be part of sublatch 100B, and may accordingly be referred to herein as an output inverter of the sublatch 100B.) The third domino sublatch circuit 100C is also coupled to receive the data and clock signals.

The internal circuitry of sublatch circuit 100C is shown in FIG. 6A to reveal the location of the feed forward FF connection of the outputs of inverters 30 and 32 to feedback/feed forward node 51 within stage 120C, and to show the interrelationship and operation of various parts. The binary output signal from the output node OUT is fed back by feedback/feed forward circuitry 120C through inverter 122C, which has its output coupled to node 51 that is common to the gates of pull-up transistor 20 and pull down transistor 24. In this manner, during the precharge interval when the data signal D_B is high and the clock signal CLK is low the signal on the output node OUT will turn on the pull-up transistor 20 if the node OUT was driven high during the evaluate interval, feeding Vcc back to node OUT through transistors 20 and 22 to reinforce the node's high state, or will turn on the pull down transistor 24 if the node OUT was driven low during evaluate, feeding ground back to node OUT through transistors 12 and 24 to reinforce the node's high state. Thus, it should be appreciated that transistors 20 and 24 act as an inverter when enabled by either transistor 22 or transistor 12 being turned on. That is, when enabled transistor 20 switches Vcc to the output node 121C responsive to a low signal on the feedback node 51 or else transistor 24 switches ground to the output node 121C responsive to a high signal on the feedback node 51.

Likewise, the outputs 121A and 121B of circuits 100A and 100B, respectively, are driven to the same state as that of node OUT during evaluate. Thus, the outputs of inverters 30 and 32 also turn on transistor 20 or 24 during precharge, which effectively inverts the outputs of inverters 30 and 32, to reinforce the state of the node OUT. That is, with data high and clock low during precharge transistors 10 and 14 are turned off so that the feedback and feed forward signals on node 51 can reinforce the state of node OUT.

Besides the advantage of improved immunity to noise on node OUT which results from the above described arrangement, there is also an advantage with respect to radiation immunity. That is, the combination of the two feed forward paths through circuits 100A and 100B and their respective inverters 30 and 32, and the feedback path through inverter 122C provide three paths for reinforcing the state of the output node OUT. Consequently, if any one of the output nodes of the circuits 100A, 100B or 100C is subjected to a radiation induced erroneous change of state, the signals of the other two output nodes will prevent the pull-up transistor 20 or pull down transistor 24 of circuit 100C from being switched by the disparate signal, thereby preventing the feedback circuitry 120 from reinforcing the erroneous state so that output node OUT does not latch the erroneous state. Ideally, the output node OUT will be preventing from rising above or falling below, as the case may be, the threshold level of the state it had before the radiation event.

More specifically, if radiation causes the output signal of the first domino sublatch 100A or the output signal of the second domino sublatch 100B to change state, the output signal of the other one of the first or second domino sublatches 100A and 100B and the output signal of the third domino sublatch 100C tend to keep the output signal of the third domino sublatch from changing state by preventing the pull-up transistor 20 or pull down transistor 24 of circuit 100C from being switched by the disparate signal. And if radiation tends to cause the signal on the output node 121C of the third domino sublatch 100C to change state, the output signals of the first and second domino sublatches 100A and 100B tend to restore the output signal of the third sublatch 100C from the erroneous state.

It should also be noted that the output nodes of circuits 100A, 100B and 100C are preferably physically separated sufficiently so that no two of them are subject to the effects of a single radiation incident.

Referring now to FIG. 6B, latch 602 is shown, according to an embodiment of the present invention. Latch 602, like latch 601 of FIG. 6A, includes three domino sublatches 100A, 100B and 100C, which may be referred to herein as "sublatches," whereas latch 602 may be referred to herein as the "overall" latch. Note that in FIG. 6A the output node 121C is used as one of the redundant latch nodes. In order to more completely protect from radiation effects the output node 121C may be further isolated as shown for latch 602 of FIG. 6B. (In latch 602, as in latch 601, the three sublatch circuits 100A, 100B are all the same and their internal details are shown for circuit 100C.) Sublatch circuits 100A, 100B and 100C have their outputs connected in parallel to respective output inverters 30, 32 and 34. (Inverters 30, 32 and 34 may be considered to be parts of sublatches 100A, 100B and 100C respectively, and may accordingly be referred to herein as output inverters of the respective sublatch 100A, 100B and 100C.) The inverters have their outputs tied together to provide the output node OUT for the latch circuit 602.

Figure 7A:
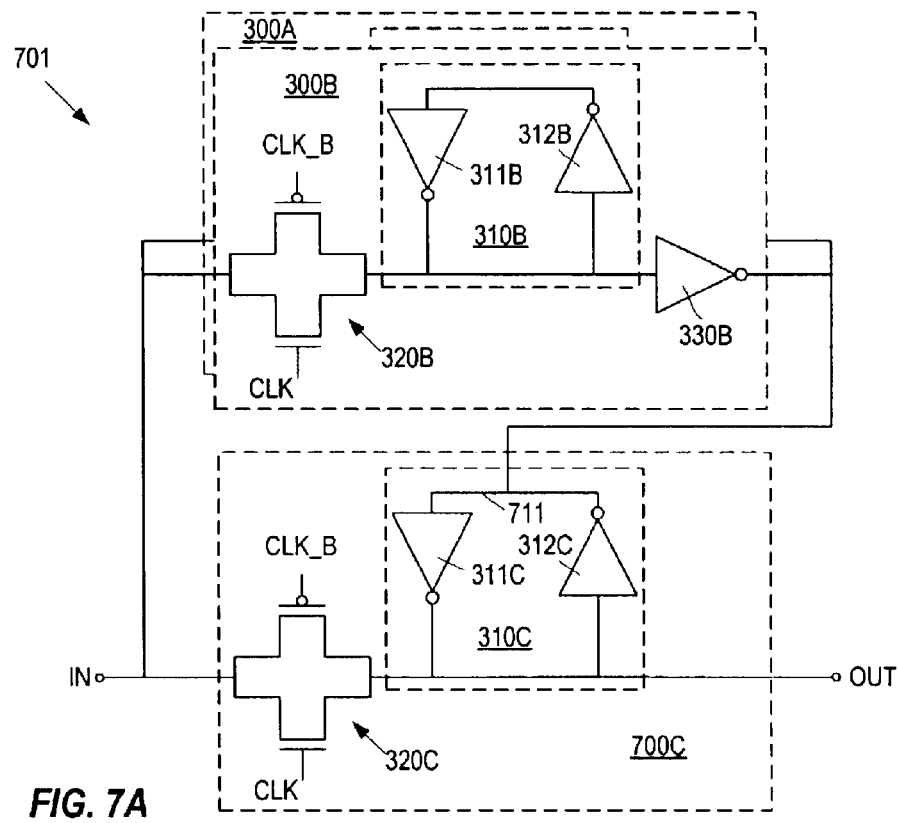
FIGS. 7A and 7B illustrate latch circuits of a memory cell type having its own form of redundancy, according to an embodiment of the present invention.

Referring now to FIG. 7A, a memory cell type latch 701 is illustrated according to an embodiment of the present invention. The latch 701 includes static latch circuits 300A, 300B and 700C, which may be referred to herein as "sublatches," whereas latch 701 may be referred to herein as the "overall" latch. Latch circuits 300A and 300B in FIG. 7A are of the circuit 300 (FIG. 3) type and are connected in parallel, the internals of which are both the same and are shown for circuit 300B. All three circuits 300A, 300B and 700C have cross-coupled dual-inverter memory cells, such as cells 310B and 310C shown, coupled to pass gate pairs, such as pass gate pairs 320B and 320C shown, which in turn are coupled to an input node IN for the latch 702 and controlled by a clock signal CLK and its complement CLK_B. The Memory cells of sublatches 300A and 300B are also coupled to respective output inverters, such as 330B shown, which have their outputs coupled to feedback/feed forward node 711 of sublatch 700C. Sublatch 700C has no output inverter, and its memory cell 310C is thus coupled directly to the output node of sublatch 700C that provides the output node OUT for the overall latch 701. For sublatches 300A, 300B and 700C in FIG. 7A, the memory cells coupled to the respective sublatch output nodes provide feedback circuitry that serve to reinforce the output signals thereon.

Unlike the twice redundant memory cell type latch 400 of the prior art FIG. 4, latch 701 in FIG. 7A has one node of its memory cells in circuits 300A and 300B coupled to both their respective input gates, such as gates 320B shown, and to their respective output inverters, such as inverter 330B shown. Likewise, the memory cell 310C in circuits 700C is coupled to both its input gates 320C and to the output node OUT. That is, the memory cells in latch 701 are not in series with the input node IN and output node OUT as in the sections 410A, 410B and 410C of prior art circuit 400. This memory cell arrangement is faster than that of circuit 400. Also, unlike the circuit 530 of FIG. 5C, which illustrates a twice redundant version of the memory cell latch 300 type as suggested by the circuit 400 of FIG. 4, latch 701 does not have a common external inverter tied to the outputs of the sections 300A, 300B and 700C. Also, the selection of latch 300 of FIG. 3 for application to the more refined twice redundancy treatment of FIG. 7B is advantageous because sublatches 300A and 300B isolate their memory cells, e.g., memory cell 330B, from the output node by inverters, e.g. inverter 330B, improving performance in comparison to the resistors of circuit 400 (FIG. 4).

Figure 7B:
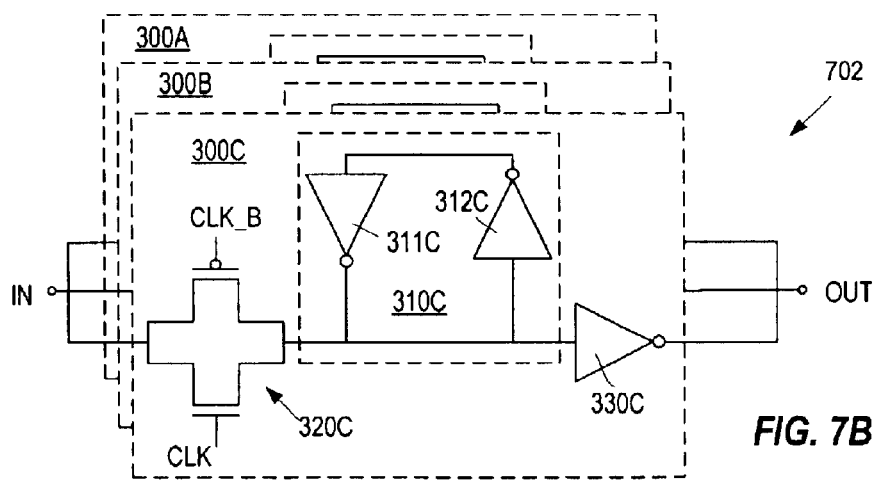

Referring now to FIG. 7B, a memory cell type latch 702 is illustrated according to an embodiment of the present invention. The latch 702 includes static latch circuits 300A, 300B and 300C, which may be referred to herein as "sublatches," whereas latch 702 may be referred to herein as the "overall" latch. Note that in FIG. 7A the output node OUT is used as one of the redundant latch nodes. In order to more completely protect from radiation effects the output node may be further isolated as shown for latch 702 of FIG. 7B. The three sublatch circuits 300A, 300B and 300C are again of the circuit 300 (FIG. 3) type connected in parallel, the internals of which are all the same and are shown for circuit 300C. As shown, circuit 300C has a cross-coupled dual-inverter memory cell 310C coupled to a pass gate pair 320C, which is in turn coupled to an input node IN for the latch 702 and controlled by a clock signal CLK and its complement CLK_B. The memory cell 310C is also coupled to an output inverter 330C which has its own output coupled to an output node OUT for the latch 702. For sublatches 300A, 300B and 300C of FIG. 7B, the memory cells coupled to the respective sublatch output nodes provide feedback circuitry that serve to reinforce the output signals thereon.

As in FIG. 7A, the latch 702 of FIG. 7B has one node of its memory cell 310C, for example, coupled to both the input gates 320C and the output inverter 330C. That is, the memory cell 310C is not in series with the input and output as in the sections 410A, 410B and 410C of prior art circuit 400. This memory cell 310C arrangement is faster than that of circuit 400. Also, unlike the circuit 530 of FIG. 5C, which illustrates a twice redundant version of the memory cell latch 300 type as suggested by the circuit 400 of FIG. 4, latch 702 does not have a common external inverter tied to the outputs of the sections 300A, 300B and 300C. Also, the selection of latch 300 of FIG. 3 for application to the more refined twice redundancy treatment of FIG. 7B is advantageous because sublatch 300C, for example, isolates its memory cell 310C from the output node by inverter 330C, improving performance in comparison to the resistors of circuit 400 (FIG. 4).

It should be appreciated that with the arrangements of FIGS. 6B and 7B, any circuit receiving the output of circuits 602 or 702 should be designed with a sufficiently insensitive switching point so that if any one of the latch nodes is subjected to a radiation induced erroneous change of state the voltage level to which the output node voltage consequently falls (or rises, as the case may be), i.e., the voltage at which the signals of the other two of the sublatch circuits hold the output node, is still above (or below) the switching point.

It should also be appreciated that with the arrangements of FIGS. 6B and 7B, the first and second sublatches are not coupled to the third sublatch by resistors, and that the first, second and third sublatches are not coupled to a common output inverter as in the prior art.

The above disclosure has been presented for purposes of illustration and is not intended to be exhaustive or to limit the invention to the form disclosed. A preferred embodiment has been disclosed. Many additional aspects, modifications and variations are also contemplated and are intended to be encompassed within the scope of the following claims.

What is claimed is:

1. A radiation resistant latch comprising:
   an overall output node;
   first, second and third sublatches,
   wherein the first, second and third sublatches each have i) input circuitry, ii) an output node coupled to the sublatch's input circuitry, and iii) feedback circuitry coupled to the sublatch's output node, for reinforcing an output signal of the sublatch,
   wherein the latch is operable to receive a data signal at the input circuitry of the first, second and third sublatches and responsively generate binary-state output signals on the respective sublatch output nodes, and
   wherein the first and second sublatches are coupled to the feedback circuitry of the third sublatch and the third sublatch has its output node coupled to the overall output node, so that if any one of the three sublatches is subjected to a radiation induced erroneous change of state, the signals of the other two sublatch output nodes tend to prevent the feedback circuitry of the third sublatch from reinforcing the erroneous state on the overall output node.

2. The radiation resistant latch of claim 1, wherein the signals of the other two output nodes preventing the feedback circuitry of the third sublatch from reinforcing the erroneous state includes i) if radiation causes the output signal of the first or second sublatch to change state, the output signal of the other one of the first or second sublatches and the output signal of the third sublatch tend to keep the output signal of the third sublatch from changing state, and ii) if radiation tends to cause the output signal of the third sublatch to change state, the output signals of the first and second sublatches tend to restore the output signal of the third sublatch from the erroneous state.

3. The radiation resistant latch of claim 1 wherein the feedback circuitry of the third sublatch includes a feedback node and an inverter, with an input of the feedback circuitry inverter coupled to the third sublatch's output node and an output of the feedback circuitry inverter coupled to the feedback node, and wherein the coupling of the first and second sublatches to the third sublatch feedback circuitry includes coupling to the feedback node.

4. The radiation resistant latch of claim 1 wherein the sublatches include domino sublatches.

5. The radiation resistant latch of claim 1, wherein the sublatches include static sublatches.

6. The radiation resistant latch of claim 1, wherein the first and second sublatches are not coupled to the third sublatch by resistors.

7. The radiation resistant latch of claim 1, wherein the first, second and third sublatches are not coupled to a common output inverter.

8. The radiation resistant latch of claim 6, wherein the first, second and third sublatches are not coupled to a common output inverter.

9. The radiation resistant latch of claim 8 wherein the feedback circuitry of the third sublatch includes a feedback node and an inverter, with an input of the feedback circuitry inverter coupled to the third sublatch's output node and an output of the feedback circuitry inverter coupled to the feedback node, and wherein the coupling of the first and second sublatches to the third sublatch feedback circuitry includes coupling to the feedback node.

10. The radiation resistant latch of claim 9, wherein the sublatches include domino sublatches.

11. The radiation resistant latch of claim 9, wherein the sublatches include static sublatches.

12. A radiation resistant latch comprising:
    an overall output node;
    first, second and third sublatches,
    wherein the first, second and third sublatches each have i) input circuitry, ii) an output node coupled to the sublatch's input circuitry, and iii) feedback circuitry coupled to the sublatch's output node, for reinforcing an output signal of the sublatch,
    wherein the latch is operable to receive a data signal at the input circuitry of the first, second and third sublatches and responsively generate binary-state output signals on the respective sublatch output nodes,
    wherein the first and second sublatches are coupled to the third sublatch and the third sublatch has its output node coupled to the overall output node such that if any one of the three sublatches is subjected to a radiation induced erroneous change of state, the signals of the other two sublatch output nodes reduce an effect of the feedback circuitry of the third sublatch on an overall output signal for the latch, and
    wherein the first and second sublatches are not coupled to the third sublatch by resistors.

13. The radiation resistant latch of claim 12, wherein the first, second and third sublatches are not coupled to a common output inverter.

14. The radiation resistant latch of claim 12, wherein the coupling of the first and second sublatches to the third sublatch includes first and second sublatch output nodes being coupled to the feedback circuitry of the third sublatch.

15. The radiation resistant latch of claim 12, wherein the sublatches include domino sublatches.

16. The radiation resistant latch of claim 12, wherein the sublatches include static sublatches.

17. A method of operating a radiation resistant latch, the method comprising the steps of:
    receiving a data signal at input circuitry of first, second and third sublatches and responsively generating binary-state sublatch output signals on output nodes of the respective sublatches, wherein feedback circuitry of such a sublatch generates a feedback signal responsive to the sublatch's output signal and feeds the feedback signal back to the sublatch's output node to reinforce the sublatch output signal;
    feeding the output signal of the third sublatch to an output node for the overall latch;
    feeding the output signals of the first and second sublatches to the feedback circuitry of the third sublatch, wherein responsive to a radiation induced erroneous change of state of the output signal of one of the three sublatches, the signals of the other two sublatch output nodes tend to prevent the feedback circuitry of the third sublatch from reinforcing the erroneous state on the overall output node.

18. The method of claim 17, wherein the signals of the other two sublatch output nodes tending to prevent the feedback circuitry of the third sublatch from reinforcing the erroneous state on the overall output node includes the signals of the other two sublatch output nodes tending to correct the erroneous state on the overall output node.

19. The method of claim 17, wherein the signals of the other two sublatch output nodes tending to prevent the feedback circuitry of the third sublatch from reinforcing the erroneous state includes the output signal of the other one of the first or second sublatches and the output signal of the third sublatch tending to keep the output signal of the third sublatch from changing state if the radiation causes the output signal of the first or second sublatch to change state.

20. The method of claim 17, wherein the signals of the other two sublatch output nodes tending to prevent the feedback circuitry of the third sublatch from reinforcing the erroneous state includes the output signals of the first and second sublatches tending to restore the output signal of the third sublatch from the erroneous state if the radiation tends to cause the output signal of the third sublatch to change state.

* * * * *